United States Patent
Wang

(10) Patent No.: US 6,806,451 B2
(45) Date of Patent: Oct. 19, 2004

(54) MEDIA FOR ENHANCED OPTICAL AUTO-FOCUS PERFORMANCE AND METHODS FOR USING SAME

(75) Inventor: Tangyu Wang, Coquitlam (CA)

(73) Assignee: Creo Inc., Burnaby (CA)

( * ) Notice: Subject to any disclaimer, the term of this patent is extended or adjusted under 35 U.S.C. 154(b) by 225 days.

(21) Appl. No.: 10/245,754

(22) Filed: Sep. 18, 2002

(65) Prior Publication Data

US 2003/0071192 A1 Apr. 17, 2003

(51) Int. Cl.[7] .............................. G02B 27/40; G02B 7/04
(52) U.S. Cl. ................................ 250/201.2; 250/201.5; 369/284; 430/270.11
(58) Field of Search ........................... 250/201.2, 201.4, 250/201.5, 216, 226; 369/13.35, 112.01, 283, 284; 430/270.11, 270.12, 495.1; 346/135.1; 396/111

(56) References Cited

U.S. PATENT DOCUMENTS

| 5,248,992 A | | 9/1993 | Ferschl ........................ 347/258 |
| 5,260,165 A | * | 11/1993 | Satou et al. ............ 430/270.16 |
| 5,273,860 A | * | 12/1993 | Nishida et al. ......... 430/270.12 |
| 6,137,580 A | | 10/2000 | Gelbart ..................... 250/201.5 |

* cited by examiner

*Primary Examiner*—Kevin Pyo
(74) *Attorney, Agent, or Firm*—Oyen Wiggs Green & Mutala

(57) ABSTRACT

A multi-layer imaging medium has a layer that absorbs radiation at a wavelength used by an optical auto-focus system. Spurious reflections are suppressed. The layer transmits radiation at a wavelength used to image the medium. The layer may function as a support layer for the medium. Thermal imaging media may be made according to the invention.

28 Claims, 3 Drawing Sheets

MEDIA FOR ENHANCED OPTICAL AUTO-FOCUS PERFORMANCE AND METHODS FOR USING SAME

PRIORITY APPLICATION

The benefit of the filing date of Canadian patent application No. 2,357,430 filed on 18, Sep. 2001 is claimed.

TECHNICAL FIELD

The invention pertains to the field of imageable media and, in particular, to a multi-layer media having improved imaging performance.

BACKGROUND

Laser based digital imaging systems are commonplace in graphic arts and other imaging industries. In such systems, radiation from a laser, or an array of lasers, is focused onto an imaging medium to write an image. The radiation causes a change in the imaging medium. The emergence of higher power lasers has enabled the use of relatively insensitive media that can be handled in daylight and require less post-imaging processing to form or fix the image than earlier media.

An immediate benefit of high power imaging systems is increased imaging speed and system productivity. This is of growing importance in imaging industries. The goal of maximizing the power density of the imaging spot leads to the use of high numerical aperture (N.A.) imaging optics that conserve the brightness of the laser source. While high N.A. imaging is effective in increasing power density, systems having a high N.A. have a correspondingly narrow depth of focus. This means that the energy density of the spot will change significantly if the spot is even a few microns out of focus. This causes changes in imaged density, commonly known as imaging artefacts. Such artefacts can render the imaged media unsuitable for use.

As imaging N.A. increases with advancing technology, it becomes difficult to maintain the mechanical precision necessary to hold the system in focus. At some point, it becomes more practical to use an auto-focus system to continuously monitor and correct the focus of the imaging system rather than continue to tighten already tight mechanical tolerances.

Optical auto-focus systems are available. Such systems use a variety of techniques involving the analysis of a reflected beam to determine positional or focus information. A specific example is disclosed in Gelbart, U.S. Pat. No. 6,137,580, which is hereby incorporated herein by reference. Gelbart discloses an auto-focus system that reflects an incident beam from a surface. The Gelbart system has a position sensitive detector to receive the reflected beam and detect the position of the surface. The incident beam can be at a wavelength different from that of the imaging laser radiation. This has the advantage of separating auto-focus signals from writing signals to avoid crosstalk.

Such a system can be very effective in focusing on a wide variety of media surfaces with sufficient precision to support imaging at high N.A. For many commonly used media the focusing system works reliably with sufficient latitude to accommodate variations in the environment, imaging apparatus or the media itself.

Some lithographic plates have a substantially transparent layer coated over the active material. These transparent layers are deposited for a variety of reasons such as providing an oxygen barrier, protecting a delicate active layer, reducing the amount of ablated product or altering the properties of the plate surface. Most such media are imaged through the transparent layer, which could result in problems for an auto-focus system.

Another category of imaging media known generally as 'thermal transfer media' operate through a transfer of a donor material to a receiver or base, the transfer being activated by a laser imaging source. These media commonly have a donor material, which could be a dye or a pigment emulsion, adhered to a support layer. The support layer is commonly transparent which gives rise to the problematic situation where there is more than one surface capable of reflecting a focus beam.

Thermal transfer media for digital color proofing and some films are particularly susceptible to auto-focus problems. A dye-donor element is a transparent polyester film layer with a dye layer of a particular color adhered to the rear surface. The dye layer is imagewise exposed to radiation through the transparent layer, transferring the dye onto the dye-receiver base. The actual transfer process differs from medium to medium but commonly involves ablation, phase change, dye sublimation, or some sort of laser-induced transfer. Proofing media are commonly available in the base CMYK colors as well as many spot colors, which means that an auto-focus system may have to work on a great variety of different materials.

Modern imaging systems are expected to achieve a high level of efficiency and reliability. Customers have the expectation that failures will be rare since an un-noticed flaw in an imaging job can cause significant wastage and delay.

There is a general need to provide cost effective methods and apparatus for imaging which provide good reliability and efficiency.

SUMMARY OF THE INVENTION

This invention provides multi-layer media in which spurious reflections of significant intensity, which degrade auto-focus system performance, are suppressed. The invention also relates to methods for making and using such media. The invention may be applied to media of a wide range of different types. Preferred embodiments employ commonly known manufacturing steps in the fabrication of the improved media.

Further aspects of the invention and features of specific embodiments of the invention are described below.

BRIEF DESCRIPTION OF THE DRAWINGS

In drawings which illustrate non-limiting embodiments of the invention.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

The inventor has determined that auto-focus failures in pre-press imaging and proofing steps can be reduced through the use of modified imaging materials.

Figure 1:
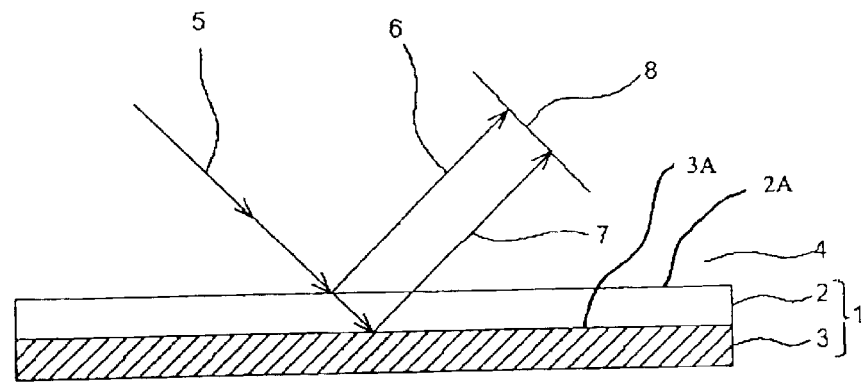
FIG. 1 is a schematic cross section through a prior art imaging medium and auto-focus system.

FIG. 1 illustrates a problem that occurs when an optical auto-focus system is used to focus on a multi-layer medium which has layers that are either partially or substantially transparent at a wavelength used by the auto-focus system. FIG. 1 shows an example of a medium 1 which has layers 2 and 3. Medium 1 may comprise an additional support layer (not shown). An auto-focus beam 5 is incident on the surface of medium 1. Layer 2 is at least partially transparent at the wavelength of beam 5. As a result, two beams are reflected from medium 1. A primary reflected beam 6 is reflected at front surface 2A of layer 2. A second spurious reflected beam 7 is generated at the interface 3A between layer 2 and layer 3.

When reflected beam 6 is significantly more intense than spurious beam 7 then the output of a position-sensing element, such as a position sensitive detector ("PSD") (not shown), at plane 8 may be affected by spurious beam 7. This can cause the auto-focus system to focus at the wrong point. This error can occur in any situation where the second spurious reflection 7 is clearly discernable against the stray or ambient light and will increase as beam 7 increases in intensity. Optical auto-focus systems typically only require a small fraction of the incident light to return to the position sensitive element in order to operate. For common materials the relative intensity of the reflection typically ranges from fractions of a percent to a few percent of the incident light which is typically sufficient.

The intensity of primary reflected beam 6 depends upon the mismatch between the refractive indices of the surrounding air 4 and the material of layer 2. For a beam at normal incidence the fraction of the incident beam that will be reflected at the air/layer interface of surface 2A is given by:

$$\left( \frac{n_{air} - n_{layer}}{n_{air} + n_{layer}} \right)^2 \quad (1)$$

Equation (1) is not completely valid for beams incident at an angle to the surface, but for the purposes of clarifying the present invention, the departure is not significant.

A common material used as a transparent support in imaging media is cl ear polyester film of which MYLAR® manufactured by DuPont is a well known example. MYLAR has a refractive index of roughly 1.65. As a first example, assume that a two layer medium as shown in FIG. 1 has, as layer 2, a sheet of MYLAR and, as layer 3, a dye or other colorant having 5% reflectivity at the auto-focus wavelength. Inserting the refractive index for MYLAR into Equation (1) with $n_{air}=1.0$, yields a reflected beam 6 of around 6% of the incident beam intensity. Spurious reflection 7 has an intensity of around 5% of the incident beam energy. Under these conditions, where beam 6 and beam 7 are almost of equal intensity, significant possibility of an auto-focus failure exists.

Another problem can occur where beams 6 and 7 overlap at the PSD. Where the beams originate from a source of coherent radiation, such as a laser diode, reflected beams 6 and 7 can form interference fringes where they overlap. Minute variations of the layer thickness will modulate the signal generated at the PSD causing further difficulties for the auto-focus system.

The inventor has determined that any lithographic plate, film or proofing media type that has multiple layers, particularly where one or more of the layers is at least partially transparent at the wavelength of the auto-focus system, can give multiple reflections which cause auto-focus problems.

Because of the wide variety of materials that imaging systems are required to image, it is probable that some combinations will generate the problematic circumstances described above. Additionally, due to the variation in material and coating, this effect is not consistent for any particular medium, so that an attempt to offset the auto-focus calibration to account for the problem is likely to be frustrated by these variations.

Figure 2:
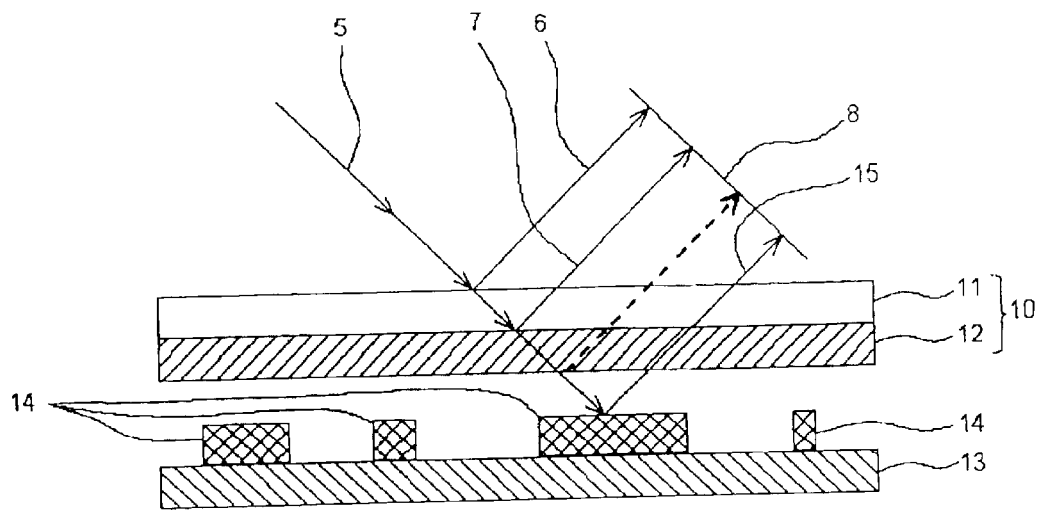
FIG. 2 is a schematic cross section through a prior art proofing medium and auto-focus system.

Color proofs are commonly made by imaging a number of color separations in sequence. This gives rise to yet another problem, in that previously written separations can give rise to further spurious reflections that again cause auto-focusing difficulties. FIG. 2 shows a proofing medium which comprises a donor 10 and a receiver base 13. Donor 10 comprises a transparent support 11 and a colorant layer 12. Colorant layer 12 may, for example, comprise a layer containing a suitable dye. Receiver base 13 has areas 14, which were written in a previously imaged color separation. If colorant layer 12 is even partially transparent at the wavelength of the auto-focus beam 5, then it is possible for another spurious reflected beam 15 to originate from previously written areas 14. Reflected beam 15 can be particularly problematic if the patterns of previously written areas 14 generate an auto-focus servo resonance frequency. A complex servo system typically has resonances, which if excited, can seriously degrade operation. Because of the wide variety of patterns that are written in normal imaging jobs the possibility of exciting a resonance cannot be avoided. In the medium of FIG. 2 a further spurious reflected beam may arise at the bottom side of layer 12. This reflected beam can cause further auto-focus problems.

This invention provides imaging materials which absorb radiation at the auto-focus wavelength to suppress part or all of the spurious reflections. The absorption may be provided in any of a variety of different ways.

In this specification, the front surface of the medium is the surface of the front layer, which is the outermost layer facing the auto-focus system. The term "primary reflection" means a reflection from the front surface of the medium. The term "spurious reflection" means any reflection from a surface or interface other than the front surface of the medium. The term "imaging media" is used to refer to any radiation-sensitive compositions that are imageable by an imagewise controllable radiation source. Without limitation, imaging media include materials coated with resists, printing plates, films for making image masks, films for making color proofs, as well as compositions which are deposited, sprayed, coated or rejuvenated just before imaging.

Figure 3:
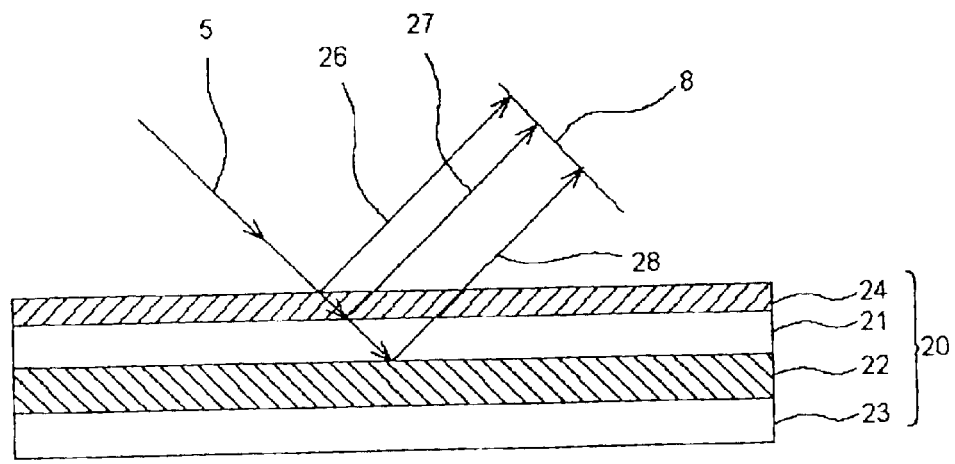
FIG. 3 is a schematic cross section through an imaging medium according to one embodiment of the invention.

FIG. 3 shows an imaging medium 20 according to a preferred embodiment of this invention. Multi-layer medium 20 comprises a layer 21 that is at least partially transparent, colorant layer 22. Where medium 20 does not operate by transferring material from layer 22 to a receiver base then medium 20 may comprise an optional support 23. Layer 21 could also act as the support. An additional layer 24 is coated on top of partially transparent layer 21. Layer 24 at least partially absorbs the radiation of auto-focus radiation beam 5. Layer 24 at least partially transmits writing radiation so that the writing radiation can image colorant layer 22.

Wavelengths used to image media vary. A common wavelength range used to image thermal media is 790 nm to 980 nm. Wavelengths in the range of 815 nm to 835 nm are most common. An auto-focus system may use radiation of any convenient wavelength(s). An auto-focus system is typically designed to operate at wavelengths that are different enough from the imaging wavelengths to permit suitable filter elements, such as dichroic components, to be used to block imaging radiation from interfering with the operation of the auto-focus system. The wavelength-dependent reflectivity and absorbance of the media with which the auto-focus system is expected to be used are also factors in selecting appropriate auto-focus wavelengths.

Reflected beam 26 is generated by the mismatch in refractive index between layer 24 and the surrounding air and forms a primary reflected beam for the auto-focus system. A spurious reflected beam 27 arises at the interface between layers 21 and 24. Another spurious reflected beam 28 arises at the interface between layers 21 and 22. The radiation in each of reflected beams 27 and 28 has passed twice through absorptive layer 24 before reaching position sensor plane 8. The radiation is attenuated each time it passes through layer 24. By the time that beams 27 and 28 reach a detector at plane 8, they are significantly reduced in intensity so that they are much less likely to cause difficulty for auto-focus system operation than would be the case if layer 24 were not present.

The improvement can be illustrated in the following second example. In some embodiments, layer 24 has a transmissivity at the wavelength of auto-focus beam 5 of 0.5 or less. For example, if a layer 24 which absorbs 65% of the radiation of auto-focus beam 5 (i.e having a transmissivity of 0.45) were added to the medium of the first example above to yield a medium as shown in FIG. 3 then reflected beam 28 would have an intensity of around 0.5% of incident beam 5. This is a factor of ten improvement over the first example. The intensity of reflected beam 27 is dependent on the refractive index mismatch between layer 24 and layer 21 and will be negligible for many typical choices of material 24.

The absorption layer is particularly effective because the light of spurious reflections must pass through this layer twice to get back to the PSD. Only modest absorption in layer 24 is required for a substantial improvement in the signal ratios. This will significantly improve the reliability of a system that, without the present invention, might be marginal. As an alternative to, or in addition to, providing a separate layer 24 which absorbs auto-focus radiation, the invention may be practiced by making an existing layer absorb auto-focus radiation.

It is not necessary to completely eliminate spurious reflections. In many situations, an auto-focus failure is intermittent, occurring only under certain circumstances such as a particular batch of media or a specific color separation or pattern. The occurrence of such intermittent failures is often a sign of insufficient operating margin. A system with good operating margin would not be disturbed by small changes in environment, the imaging apparatus, or the media being imaged. It is thus only necessary to reduce the level of the spurious reflections to a point where the system has sufficient operating margin. For example, in some cases, satisfactory auto-focus performance may be ensured by suppressing spurious reflected beams so that they have intensities not exceeding ¼, ⅕ or 1/10 of an intensity of the primary reflected beam.

The choice of absorptive material will depend on the type of media. A general requirement is that the material should have high transmittance at the write beam wavelength and good absorbance at the auto-focus beam wavelength. Since the absorption requirements are quite modest, the choice of dyes and materials that may be used to provide absorption is wide. The material chosen should not exhibit bleaching under normal ambient lighting.

A medium as shown in FIG. 3 may be made by applying a layer 24 of an absorptive material onto the front surface of a support substrate layer in a multi-layer coater. Alternatively, the material may be applied in a second pass through a coater. Limitations on the minimum thickness of coating that can be applied by a particular coater may dictate the deposition of a layer thickness for a particular absorbent material that will yield more absorption than required. This is of no consequence as long as there is good transmittance at the write laser wavelength. Where the invention is practiced by applying a layer of an absorptive material to another layer then the absorptive material should be a material which adheres well to the other layer.

Figure 4:
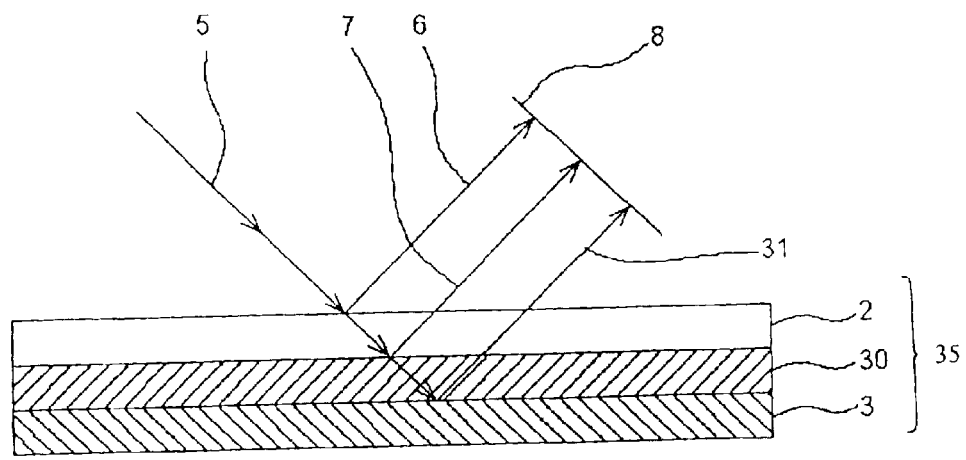
FIG. 4 is a schematic cross section through an imaging medium according to an alternative embodiment of the invention; and, FIG. 5 is a schematic cross section through an imaging medium according to another embodiment of the invention.

A medium 35 according to an alternative embodiment of the invention is shown in FIG. 4. Medium 35 has an absorptive layer 30 located between a transparent layer 2 and a colorant layer 3. Medium 35 may be made by coating absorptive layer 30 onto substrate 2 and then coating colorant layer 3 onto absorptive layer 30. This simplifies production because the coater is not required to coat on both sides of the substrate. Where medium 35 is made in this manner, the colorant material of layer 3 and the absorptive material of layer 30 should selected to minimize mixing during the coating process.

In medium 35 an additional spurious reflection 31 may be generated at the interface between the substrate layer 2 and the absorptive layer 30. This reflection is relatively small since layer 30 is selected to absorb of the auto-focus beam wavelength and hence its reflectivity at the auto-focus wavelength is low.

Figure 5:
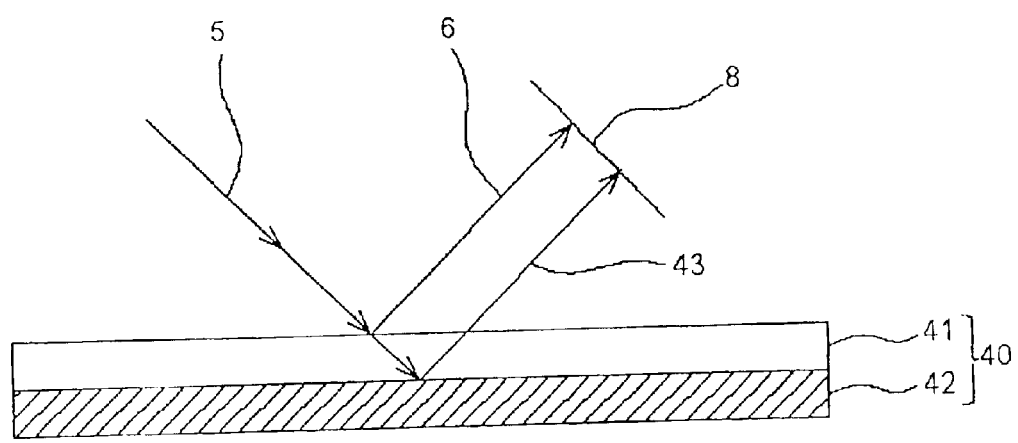

FIG. 5 shows a medium 40 according to a further alternative embodiment of the invention. Medium 40 comprises a layer 41 that is at least partially transparent and a dye layer 42. A material which absorbs radiation at the wavelength used by the auto-focus system is dispersed through layer 41. Layer 41 could serve as a support layer or medium 40 could comprise an additional support layer (not shown).

As incident beam 5 traverses layer 41 it is attenuated. Spurious reflected beam 43, which is reflected at the interface between layers 41 and 42 is further attenuated on its path back through layer 41 to detector plane 8. Sufficient absorbing material is dispersed in layer 41 so to provide sufficient discrimination between beams 6 and 43 at the detector plane 8.

Where the medium is a film or proofing medium, a polyester film which absorbs at the wavelength of the auto-focus beam may be used. Industrial polyester films are commonly available in a number of color tints. Tinted polyester may not be commonly available for imaging applications that require an optical grade that is sometimes referred to as "glass clear". The optical grade is not normally tinted for imaging applications but the tinting methods used in industrial and packaging polyesters can be applied to imaging grade polyester films. This embodiment is particularly advantageous in that polyester is commonly fabricated in a separate process and the media production process remains unchanged except for the use of an only slightly altered polyester substrate. The film may, for example, be tinted blue so that it absorbs red light strongly and is substantially transparent to infrared radiation. Red light may then be used for auto-focusing while infrared radiation is used for imaging.

While the invention is described with reference to these specific embodiments there are many more media having multiple layers that will benefit from the addition of absorption at the auto-focus radiation source wavelength according to this invention.

It can be appreciated that, in addition to providing imaging media, the invention provides an auto focus method for use in imaging an imaging medium. The method comprises reflecting a first beam of light having a first wavelength from at least one of the plurality of layers to form more than one reflected beam of light; substantially absorbing all but one of the more than one reflected beam of light within the imaging medium to obtain a primary reflected beam of light; and, changing the focus of a second beam of light of a second wavelength based on information obtained from the primary reflected beam of light.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. An auto-focus method for use in imaging an imaging medium comprising a plurality of layers, the method comprising:
    reflecting a first beam of radiation having a first wavelength from a front surface of the imaging medium to yield a primary reflected beam while allowing radiation of the first wavelength to be absorbed within the imaging medium to suppress spurious reflected beams of radiation of the first wavelength;
    detecting the primary reflected beam and, based on information obtained from the primary reflected beam, changing a focus of an imaging radiation beam incident on the front surface, the imaging radiation beam having a second wavelength different from the first wavelength, the imaging radiation beam imparting an image to the imaging medium.

2. The method of claim 1 wherein the second wavelength is in the range of 790 nm to 980 nm.

3. The method of claim 2 wherein the second wavelength is in the range of 815 nm to 835 nm.

4. The method of claim 1 comprising absorbing sufficient radiation of the first wavelength within the imaging medium to reduce intensities of any spurious reflected beams to intensities not exceeding ¼ of an intensity of the primary reflected beam.

5. The method of claim 1 comprising absorbing sufficient radiation of the first wavelength within the imaging medium to reduce intensities of any spurious reflected beams to intensities not exceeding ⅕ of an intensity of the primary reflected beam.

6. The method of claim 1 comprising absorbing sufficient radiation of the first wavelength within the imaging medium to reduce intensities of any spurious reflected beams to intensities not exceeding 1/10 of an intensity of the primary reflected beam.

7. The method of claim 1 wherein detecting the primary reflected beam comprises determining a position of the primary reflected beam.

8. The method of claim 1 wherein the first wavelength is a wavelength of visible light.

9. The method of claim 8 wherein the first wavelength is a wavelength of red light.

10. The method of claim 8 wherein the second wavelength is an infrared wavelength.

11. An imaging method comprising:
    providing an imaging medium comprising:
    I) an imaging layer comprising a material capable of being patterned by application of focused radiation of an imaging wavelength; and,
    ii) a front layer in front of the imaging layer and substantially transmissive at the imaging wavelength, the front layer absorbing radiation of an auto-focus second wavelength different from the imaging wavelength;
    reflecting a beam of light containing light of the auto-focus wavelength off of a front surface of the front layer to provide a primary reflected beam;
    detecting the primary reflected beam at a detector and generating a control signal in response to the detection of the primary reflected beam;
    using the control signal to adjust an auto-focus system; and,
    imaging the imaging layer with a beam of radiation of the imaging wavelength focused by the auto-focus system.

12. An imaging medium comprising a plurality of layers, the imaging medium imageable by radiation of an imaging wavelength, the imaging medium having a front layer which is absorbing at an auto-focus wavelength different from the imaging wavelength and an imaging layer behind the front layer.

13. The imaging medium of claim 12 wherein the front layer is substantially transparent at the imaging wavelength.

14. The imaging medium of claim 13 wherein the front layer has a transmissivity not exceeding 0.5 at the auto-focus wavelength.

15. The imaging medium of claim 12 wherein the front layer has a transmissivity not exceeding 0.5 at the auto-focus wavelength.

16. The imaging medium of claim 12 wherein the imaging wavelength is in an infrared part of the spectrum.

17. The imaging medium of claim 16 wherein the auto-focus wavelength is in a visible part of the spectrum.

18. The imaging medium of claim 16 wherein the imaging wavelength is in the range of 790 nm to 980 nm.

19. The imaging medium of claim 18 wherein the front layer is substantially transparent to all radiation having wavelengths in the range of 790 nm to 980 nm.

20. The imaging medium of claim 16 wherein the imaging wavelength is in the range of 815 nm to 835 nm.

21. The imaging medium of claim 12 wherein the front layer comprises a support layer.

22. The imaging medium of claim 21 wherein the front layer comprises a colorant dispersed in the support layer, the colorant absorbing radiation of the auto-focus wavelength.

23. The imaging medium of claim 22 wherein the colorant comprises a blue dye.

24. The imaging medium of claim 22 wherein the support layer comprises a layer of a polyester material.

25. The imaging material of claim 12 wherein the front layer comprises a layer applied to a support layer in the medium.

26. The imaging material of claim 25 wherein the front layer comprises a layer comprising a colorant, the colorant absorbing radiation at the auto-focus wavelength.

27. An imaging medium imageable at a first wavelength, the imaging medium comprising:
- a plurality of layers having different indices of refraction, the layers meeting at one or more interfaces capable of producing one or more spurious reflections of light of an auto-focus wavelength;
- at least one of the layers being an imagewise addressable layer that is capable of being imagewise changed by radiation of an imaging wavelength different from the auto-focus wavelength;
- at least one of the layers being absorptive to light of the auto-focus wavelength.

28. An imaging medium comprising:
- an imaging layer comprising a material capable of being patterned by application of focused radiation having an imaging wavelength; and,
- a layer in front of the imaging layer and substantially transmissive at the imaging wavelength, the layer absorbing radiation having an auto-focus wavelength different from the imaging wavelength.

* * * * *